United States Patent [19]
Hooper

[11] Patent Number: 5,267,175
[45] Date of Patent: Nov. 30, 1993

[54] DATA BASE ACCESS MECHANISM FOR RULES UTILIZED BY A SYNTHESIS PROCEDURE FOR LOGIC CIRCUIT DESIGN

[75] Inventor: Donald F. Hooper, Northboro, Mass.

[73] Assignee: Digital Equipment Corporation, Maynard, Mass.

[21] Appl. No.: 42,859

[22] Filed: Apr. 5, 1993

Related U.S. Application Data

[63] Continuation of Ser. No. 703,707, May 21, 1991, which is a continuation of Ser. No. 391,672, Aug. 7, 1989, which is a continuation of Ser. No. 907,515, Sep. 12, 1986.

[51] Int. Cl.$^5$ .................. G06F 15/60; G06F 15/40
[52] U.S. Cl. .................. 364/489; 364/488; 395/600
[58] Field of Search .............. 364/491, 490, 489, 488; 395/600, 650

[56] References Cited

U.S. PATENT DOCUMENTS

| | | | |
|---|---|---|---|
| T935,003 | 6/1975 | Linville et al. | 364/490 |
| 4,377,849 | 3/1983 | Finger et al. | 364/491 |
| 4,386,403 | 5/1983 | Hsieh et al. | 364/300 |
| 4,584,653 | 4/1986 | Chih et al. | 364/488 |
| 4,613,940 | 9/1986 | Shenton et al. | 364/488 |
| 4,635,208 | 1/1987 | Coleby et al. | 364/491 |
| 4,700,317 | 10/1987 | Watanabe et al. | 364/488 |

FOREIGN PATENT DOCUMENTS

| | | | |
|---|---|---|---|
| 0168650 | 1/1986 | European Pat. Off. | 364/489 |
| 1445914 | 8/1976 | United Kingdom | 364/490 |

OTHER PUBLICATIONS

Randy H. Katz, 'Managing the Chip Design Database', IEEE Computer, vol. 16, No. 12, Dec. 1983, pp. 26-35.
Guy L. Steele Jr., 'Common LISP: The Language' The Digital Press, Maynard, Masschusetts, 1984 (Table of Contents).
C. L. Forgy, "OPS5 User's Manual," Carnegie-Mellon University (Jul., 1981).
Saito et al., "A CAD System For Logic Design Based on Frames and Demons," Fujitsu-Scientific and Technical Journal, vol. 18, No. 3, pp. 437-451, (Sep., 1982).
T. Kowalski et al., "The VLSI Design Automation Assistant: An IBM System/370 Design," IEEE Design & Test of Computers, vol. 1, No. 1, pp. 60-69 (Feb., 1984).
R. Katz, "Managing the Chip Design Data Base," Computer, vol. 16, No. 12, pp. 26-36 (Dec., 1983).

(List continued on next page.)

*Primary Examiner*—Vincent N. Trans
*Attorney, Agent, or Firm*—Albert P. Cefalo; Barry N. Young

[57] ABSTRACT

In a circuit design synthesis procedure in which the pointers are added to the data base to permit a path through the circuit to be followed, a qualified object is defined to be a data object that permits access expressed by a sequence (or chain) of access forms strung together. A mechanism is defined that permits access of any object in a logic design database relative to any other object in the data base. Access forms are strung together in a given format. This structure provides an easily understandable access form and it is defined in the rule grammar. This access form can be parsed in the synthesis procedure into a nest of (LISP) program functions, which, when evaluated, will return an object in the data base. This access chain is used in the antecedent and consequence portions of the rule structure for the purpose of modifying the target objects. This access structure permits the synthesis rules to make decisions on such parameters as timing, cell size, power, wire loading, model names, etc. The rules of the synthesis procedure can be written in such a manner as to be similar to a circuit designer's rules. In addition to the access of objects, this chained access structure also permits tagging (or marking) a subset intermediate objects to be temporarily saved for use by the synthesis rules. This additional capability provides the ability to sort and partition sets of objects based on attributes and permits a synthesis procedure capable of using abstract tradeoffs.

17 Claims, 9 Drawing Sheets

OTHER PUBLICATIONS

"A Rule-Based System for Optimizing Combinational Logic" by de Geus et al., IEEE Design & Test, Aug. 1985, pp. 22-32.

Daniel et al., "CAD Systems for IC Design", IEEE Computer-Aided Design of Integrated Circuits and Systems, vol. CAD-1, No. 1, Jan. 1982, pp. 2-11.

Trimberger, "Automating Chip Layout", IEEE Spectrum, vol. 19, No. 6, Jun. 1982, pp. 38-45.

Franco et al., "The Cell Design System", IEEE 18th Design Automation Conference, paper 12.4, 1981, pp. 240-247.

Kessler et al., "Standard Cell VLSI Design: A Tutorial", IEEE Circuit and Devices Magazine, Jan. 1985, pp. 17-34.

"Inside an Expert System", B. A. Thompson and W. A. Thompson, Byte, Apr. 1985, pp. 315-330.

"Data Base Design", Gio Wiederhold, McGraw-Hill Book Company, 1983, chapters 3, 7, 8 and 10.

"Designers Build Smarts into their CAE Tools With Expert-System", Max Schindler, Electronic Design, Jul. 9, 1987, pp. 71-76.

"Natural-Language Interfaces", Elaine Rich, IEEE Computer, Sep. 1984, pp. 39-47.

"GWW: A structured environment for building natural language interface", J. Pepper et al., IEEE Computer, May 1986, pp. 85-88.

"Enhancing Knowledge Representation in Engineering Database", D. J. Hartzband et al., IEEE Computer, Sep. 1985, pp. 39-48.

DATA BASE ACCESS MECHANISM FOR RULES UTILIZED BY A SYNTHESIS PROCEDURE FOR LOGIC CIRCUIT DESIGN

This application is a continuation of application Ser. No. 07/703,707, filed May 21, 1991 which is a continuation of Ser. No. 07/391,672 filed Aug. 7, 1989, now abandoned, which is a continuation of Ser. No. 06/907,515, filed Sep. 12, 1986, now also abandoned.

RELATED PUBLICATION

The following publications and U.S. Patent Applications are related documents to the instant Application:

Managing the Chip Design Database, by Randy H. Katz, IEEE Computer, Vol. 16, No. 12, December 1983, pages 26 through 35.

Common LISP: The Language, by Guy L. Steele Jr, 1984, The Digital Press, Maynard, Mass., U.S.A.

OPSS, A "rule-based" language developed at Cargnegie-Mellon by Charles Forgy

Procedure and Data Structures for Synthesis and Transformation of Logic Circuit Designs, invented by Donald F. Hooper et al, assigned to the same assignee named herein, having U.S. Ser. No. 907,303, filed on Sep. 12, 1986, now abandoned.

Rule Structure In a Procedure for Synthesis of Logic Circuit Designs, invented by Donald F. Hooper et al, assigned to the same assignee named herein, having U.S. Ser. No. 907,512, filed Sep. 12, 1986, now abandoned.

Rule Structure for Insertion of New Elements in a Circuit Design Synthesis Procedure, invented by Donald F. Hooper et al, assigned to the same assignee named herein, having Ser. No. 907,513, filed Sep. 12, 1986, now abandoned.

Bitwise Implementation Mechanism for a Circuit Design Synthesis Procedure, invented by Donald Hooper et al, assigned to the assignee named herein, having Ser. No. 907,516, filed Sep. 12, 1986, now abandoned.

BACKGROUND OF THE INVENTION

Field of the Invention

This invention relates generally to circuit design synthesis, and more particularly, to procedures for accessing data base structures or objects of the synthesis program.

Description of the Related Art

Referring next to FIG. 1, the procedure for synthesizing a logic circuit design according to the prior art is shown. Model definition data structures from a library of component definitions are entered into the data structures associated with the synthesis data base in step 11. In step 12, the information related to the instances of the circuit design including the connectivity information is entered in the data base. The instances of the circuit design are generally in a behavioral or functional form when entered in the synthesis data base. The synthesis procedure relates the instances of the circuit design to the model instances in step 13. In step 14, a set of rules for the synthesis procedure is applied to each of the model instances and the model instances are altered and connected in such a way as to maximize certain parameters such as size, path delay, power, etc. In step 15, the resulting circuit design is placed in a format that can control the automated fabrication of the circuit.

In order to make decisions regarding such data base parameters as timing, cell size, power requirements, wire loading, model names, etc., a rule must access data structures in the synthesis system data base. The synthesis procedures of the related art can typically perform similar access operations only by evaluation of the entire circuit. A need has therefore been felt for a synthesis procedure and related syntax data access structures that will permit the access of data base objects at the end of a sequence of data base objects. Similar to OPSS, our access functions permit inspection of various slots (fields) of a data structure. But unlike OPSS, our access functions allow referencing data objects more than one field forward and backward along a circuit path, if needed, with respect to any specific data object. This ability is an essential ingredient of access forms that assist in electrically inspecting sequences of connected components.

FEATURES OF THE INVENTION

It is an object of the present invention to provide an improved procedure for the synthesis of circuit designs.

It is a feature of the present invention to permit simple access forms and mechanism to inspect a data base structure object in order to write rules of physical logic synthesis.

It is another feature of the present invention to provide a capability of accessing subsets of data base objects at intermediate locations in a chain of data base objects.

It is yet another feature of the present invention to provide a synthesis procedure capable of accessing a plurality of data base objects affecting a target data base object.

SUMMARY OF THE INVENTION

The aforementioned and other features are obtained, according to the present invention, by providing a synthesis procedure and related data base organization to permit a noun in a rule structure to be interpreted as a sequence of data base objects, the rule syntax permitting the access to either an end member of the sequence and/or marking or tagging an intermediate member of the sequence. This syntax provides the ability to sort and partition tagged sets of data base objects based on their attributes.

These and other features of the present invention will be understood upon reading of the following description along with the drawings.

DESCRIPTION OF THE PREFERRED EMBODIMENT

Detailed Description of the Figures

Figure 1:
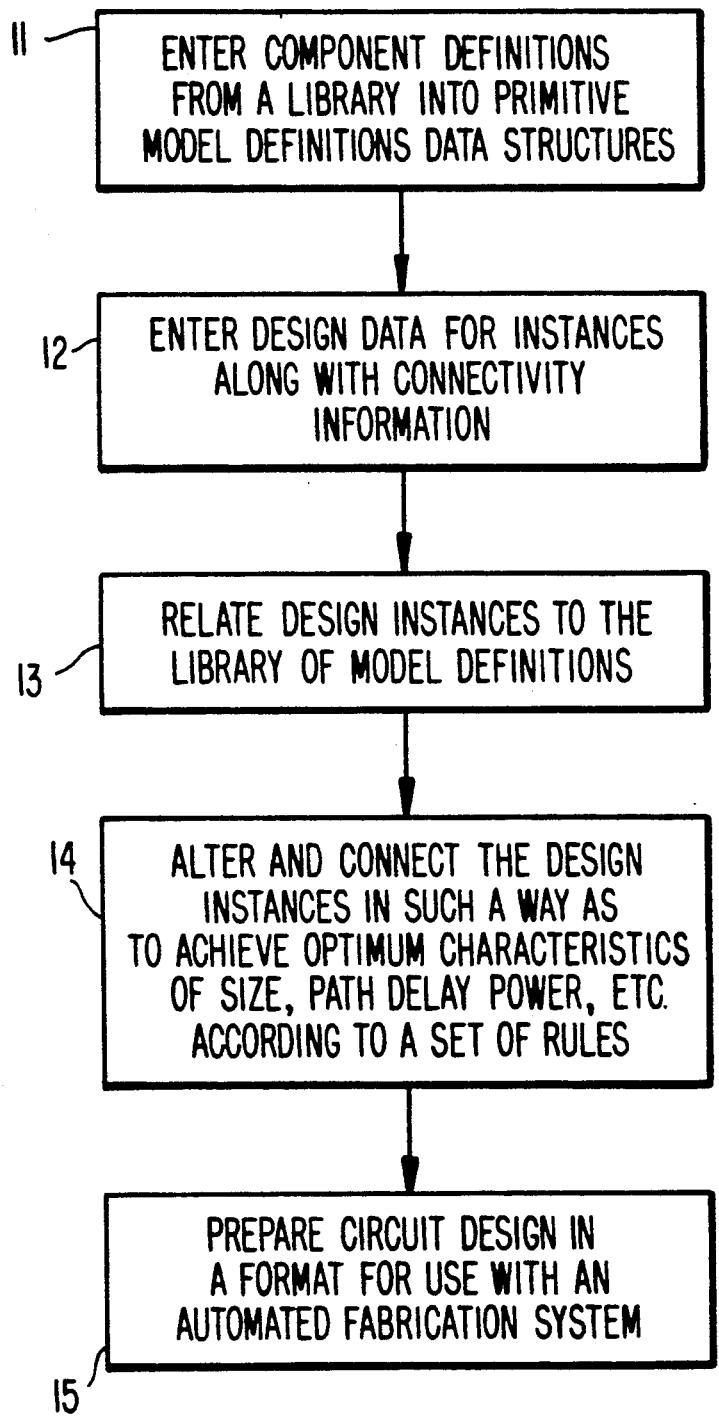
FIG. 1 is a flow diagram of the procedure for the synthesis of circuit designs according to the related art.

FIG. 1 has been described in relationship to the related art.

Figure 2:
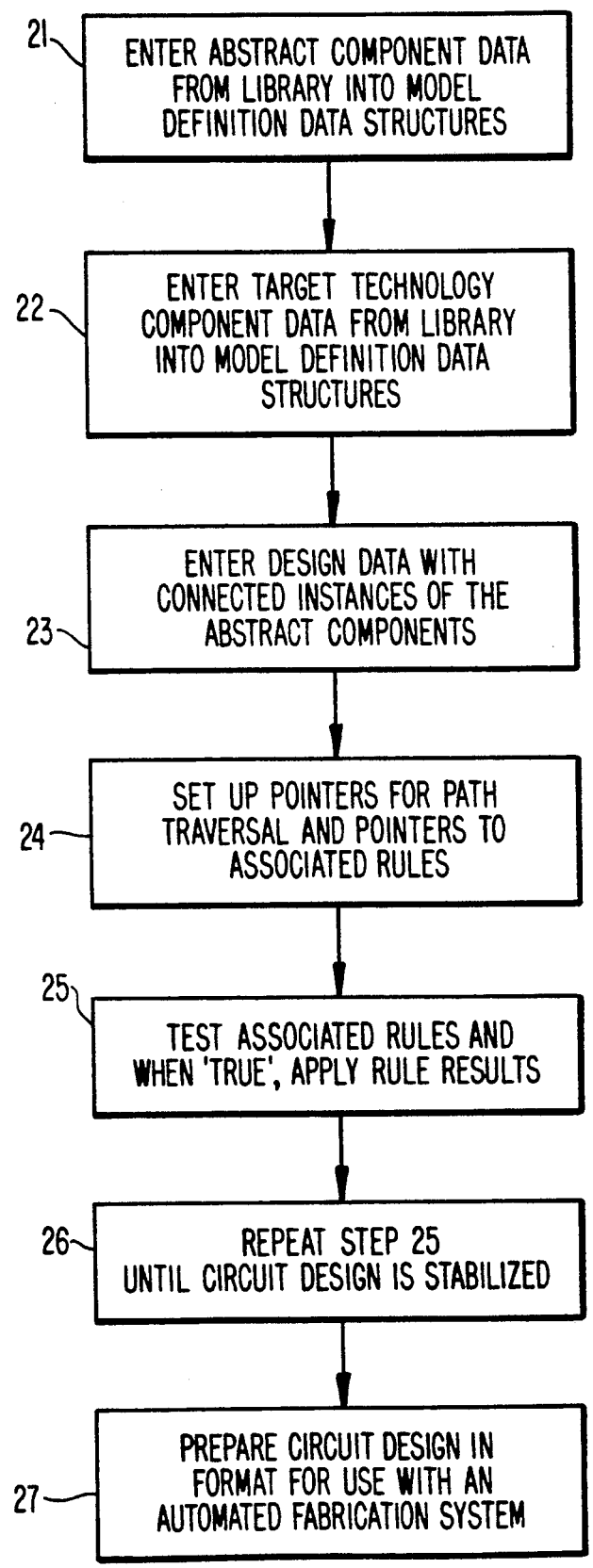
FIG. 2 is a flow diagram of an inventive procedure for the synthesis of circuit diagrams capable of supporting the present invention.

Referring next to FIG. 2, the synthesis procedure of the present invention is shown. In step 21, abstract component data from a library of such data is entered into model definition data structures of the synthesis procedure. In step 22, component data relating to the target technology from the library is entered into model definition data structures of the synthesis procedure. The circuit design data with the connected instances described in terms of abstract components is entered into the synthesis procedure in step 23. In step 24, the synthesis procedure provides two sets of pointers. The first set of pointers permits the synthesis procedure to follow any arbitrary path through the design circuit. The second set of pointers couples rules with associated data base structures. In step 25, the associated rules are tested for each instance and when the test provides a 'true' result, the consequence of the rule is implemented. In the preferred embodiment, each rule has an antecedent portion and a consequence portion. The antecedent portion includes a test algorithm, and the consequence portion provides the information required to implement a result of the test. Because the rules are applied to instances in a sequential manner, and because, in the preferred embodiment, the test procedures can involve neighboring instances that were changed as a result of a test applied to that instance, the process is repeated until the circuit design is stabilized. In step 27, the final version of the circuit design is placed in a format suitable for use in an automated circuit fabrication system.

Figure 3:
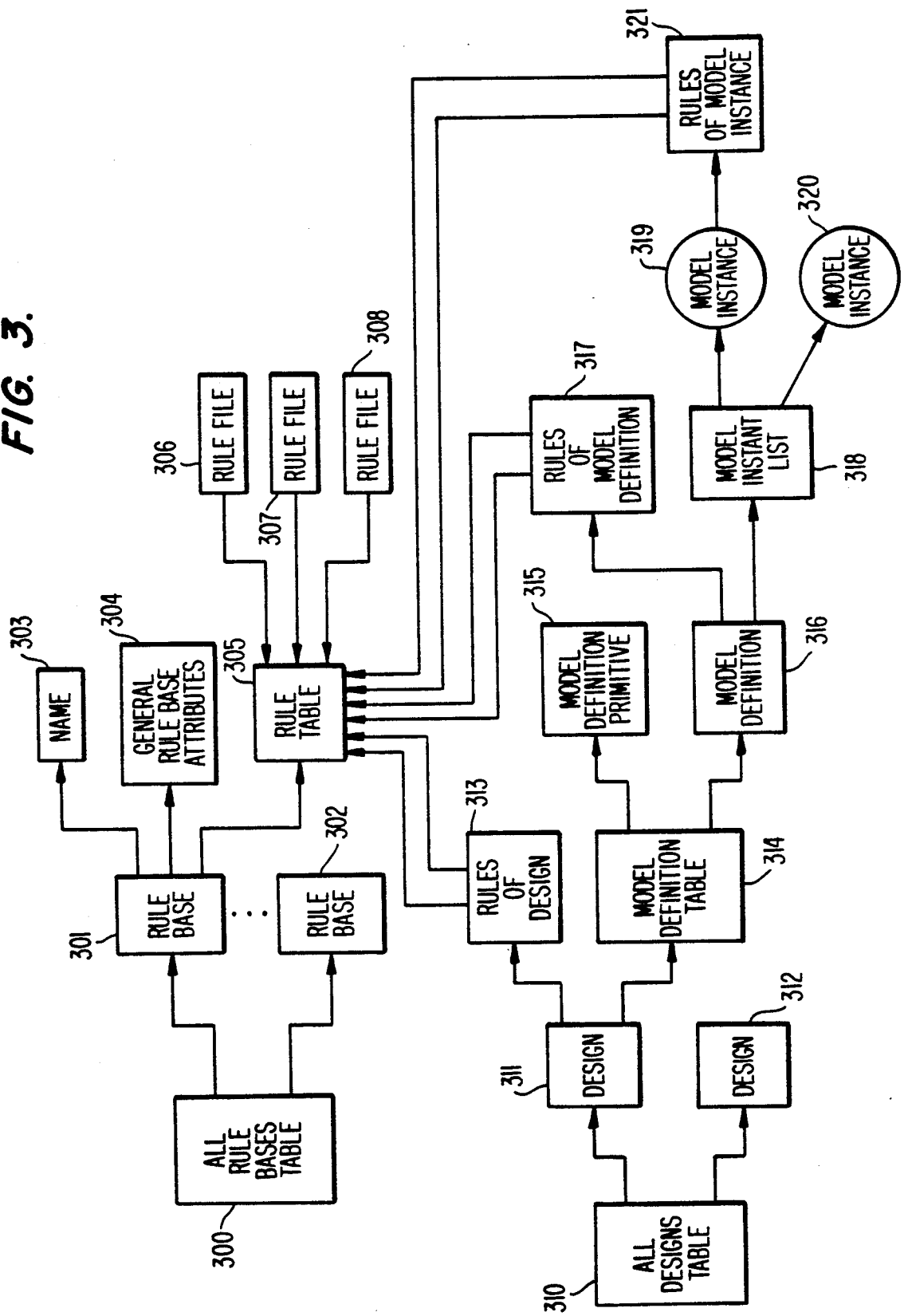
FIG. 3 is an overall diagram of the architecture for data structures of the of the logic design data base and the logic synthesis rules data base.

Referring now to FIG. 3, the architectural organization for the storage of the logic synthesis rules and the logic design rules are shown. Two storage hierarchies are available, one representing rule information and the second representing digital design information. These information hierarchies interact when pointers are established, relating the design objects to specific groups of rules. A rule file 306 through 308 is a collection of rules arbitrarily organized by the creator of the file. Several rule files can be transferred to a rule table 305. The rule table 305 is a lookup table that is indexed by the name of the rules stored therein. The rule table 305 is an attribute of a rule base 301 that has, in addition to the rules stored in rule table 305, a name 303 and other attributes 304 of the rule base. Any number of rule bases 301 through 302 are contained in the table of all rule bases 300. The all rule bases table 300 is a lookup table indexed by the name of the rule base. The all rule bases table 300 is the top of the rule information hierarchy. The logic design data is partitioned into blocks, called model definitions 315 through 316. Any number of model definitions can be stored in the model definition table 314, a lookup table indexed by the model name. A model definition can contain a model instance list 318 that includes model instances 319 and 320 that also can be model instances of other model definitions. For any functional part type or structural body of a given name, only one model definition can exist. However, any functional part type or structural body can have zero or more model instances. The attributes of the model definition are common to all of the model instances associated therewith and, therefore, need to be stored only with the model definition. The attributes of the model instances, such as timing parameters and simulation values, are unique to each model instance and consequently must be stored with the associated model instance. Those model definitions with no model instances or for which a "LIBRARY" attribute is specified are considered primitive model definitions stored in table 315. The model definition table 314 is stored in a design table 311, the design table capable of possessing other attributes. Any number of designs 311 through 312 can be contained in the all designs table 310.

Figure 4:
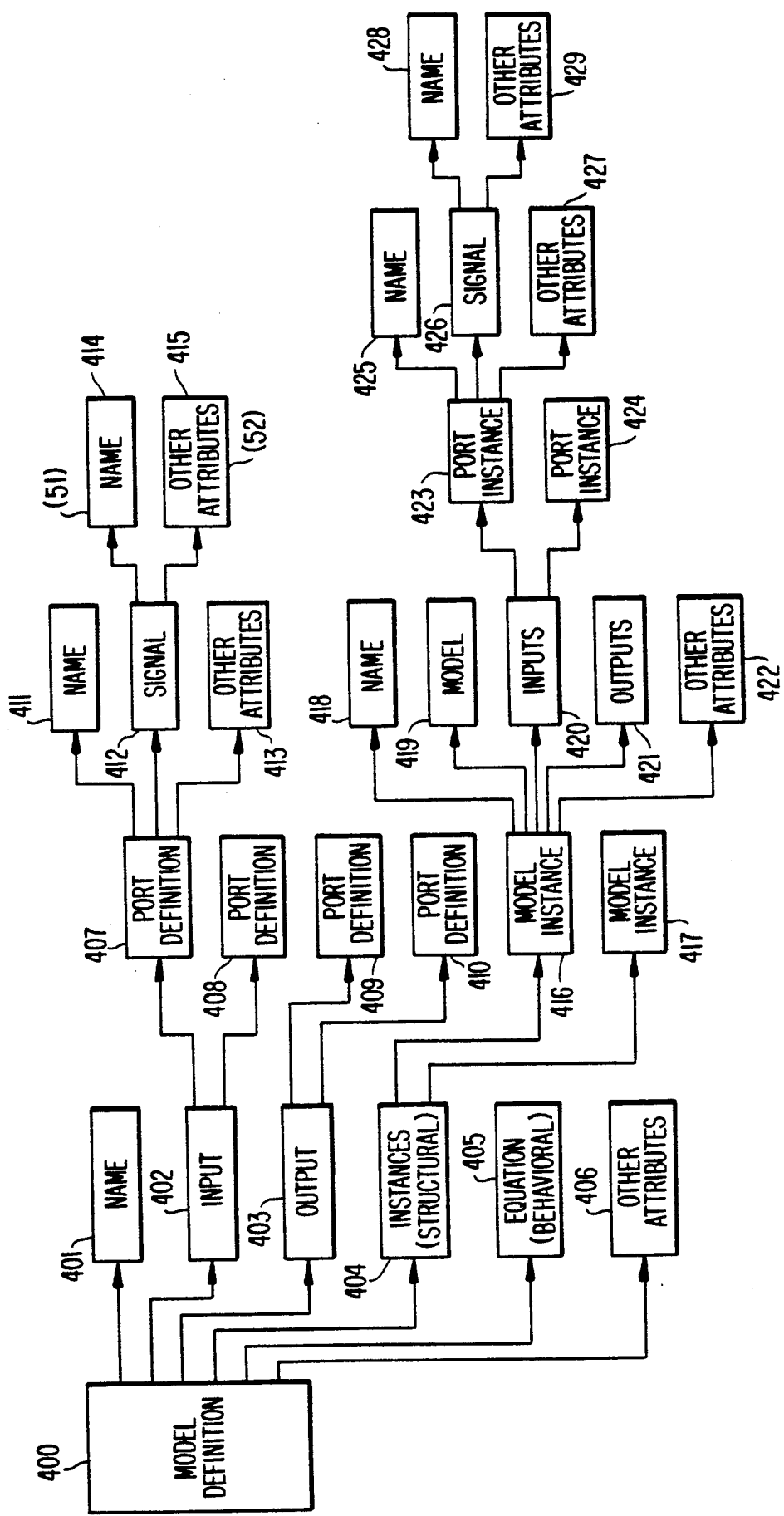
FIG. 4 is an detailed illustration of the hierarchical relationship of the objects of the design model as it is transferred between external software mechanisms and this system.

Referring to FIG. 4, the interface form of the model definition is shown. Each model definition has a name 401, an interface definition comprising input signals 402 and output signals 403 and other attributes 406. Each model definition can have a schematic, structural or data flow form in which case the model definition would have instances 404. Furthermore, a model definition can also have a functional form or a behavioral form 405. The input interface signals are tied to port definitions 407 and 408 and the interface output signals are also tied to port definitions 409 and 410. There can also be other types of interface signals such as bi-directional signals. Port definitions have a name 411, a signal 412, and other attributes 413. The signal of a port definition has a name 414 and other attributes 415. The model instances 404 can have a plurality of individual model instances 416 and 417 included therein. Each model instance 416 and 417 has a unique name 418, a name of its model definition 419, input and output interface instances 420 and 421 and other attributes 422. The interface instances 420 and 421 consist of port instances 423 and 424, while each port instance has a name 425, signals 426 and other attributes 427. Each signal has a name 428 and other attributes 429.

Figure 5:
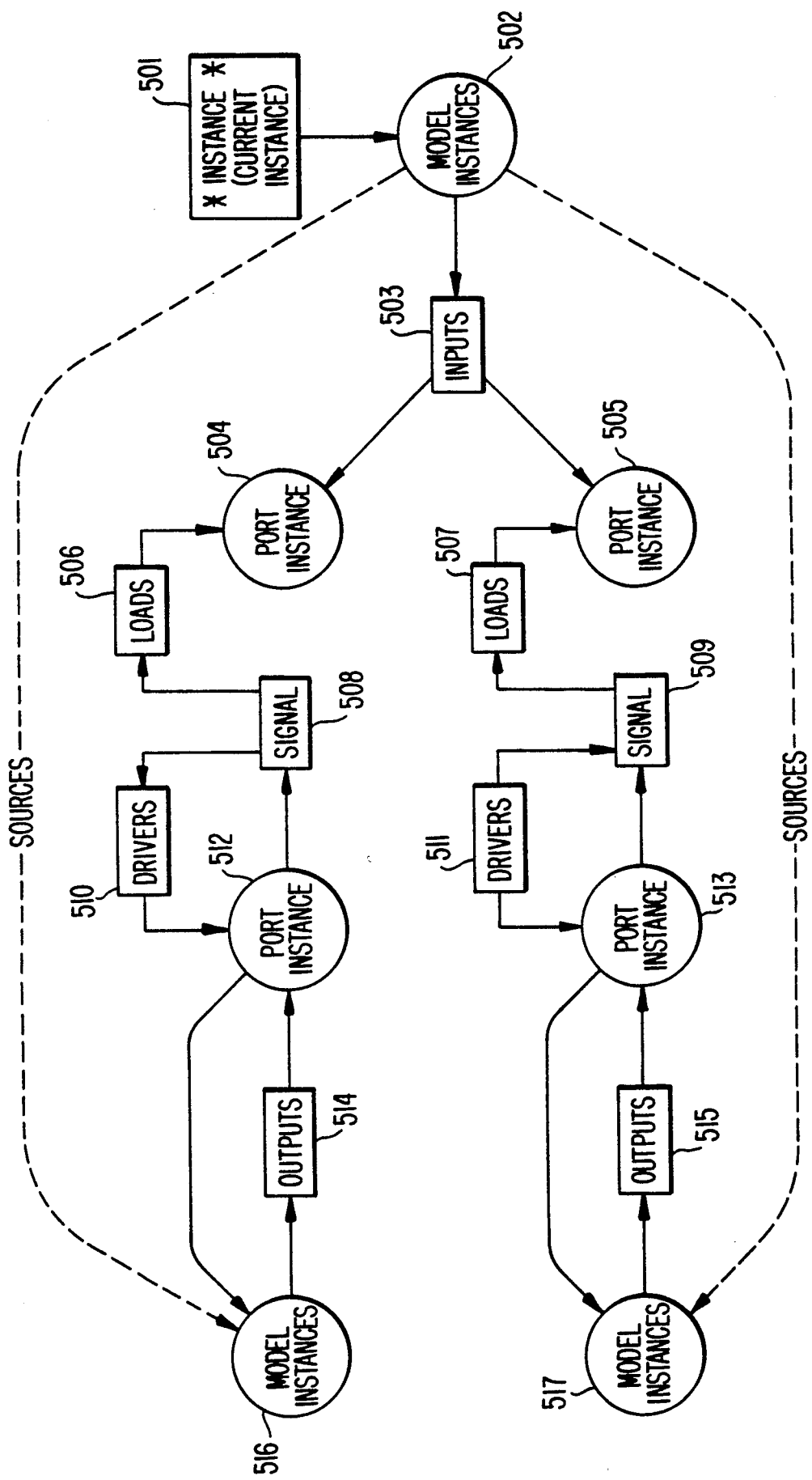
FIG. 5 is an example of the access of a logic design data base by following pointers through a sequence of objects and/or functions according to the present invention.

Referring next to FIG. 5, the access of a logic design database by following pointers through the sequence of objects and/or functions is shown. A rule is assumed to be referring to the current instance, *instance*, 501 and 502. The access syntax 'INPUTS' implies access to the list of objects 503, inputs of the model instance 502. The access syntax '1ST-INPUTS', '1ST-INS', '1ST-INPUT' or '1ST-IN' implies access to the port instance object 504. The access syntax 'SIGNALS-OF-INPUTS' implies access to signals 508 and 509. One method for accessing model instances 516 and 517 from the current instance is to use the chain 'INSTANCES-OF-DRIVERS-OF-SIGNALS-OF-INPUTS'. The access will follow the path of inputs 502, 504 and 505 to signals 508 and 509 to drivers 510, 511, 512 and 513 to model instances 516 and 517. Because this path is frequently used, a "synonymous" name is defined so that the use of the term 'SOURCES' will provide the list of instances coupled to the inputs side of the current instance. Conversely, the term 'DESTS' is defined to provide the list of instances connected to the output side of the current instance. The term 'SOURCES-OF-SOURCES' can be used to obtain a list of the sources of instances 516 and 517. If there are no sources, a null indication will be returned.

Figure 6:
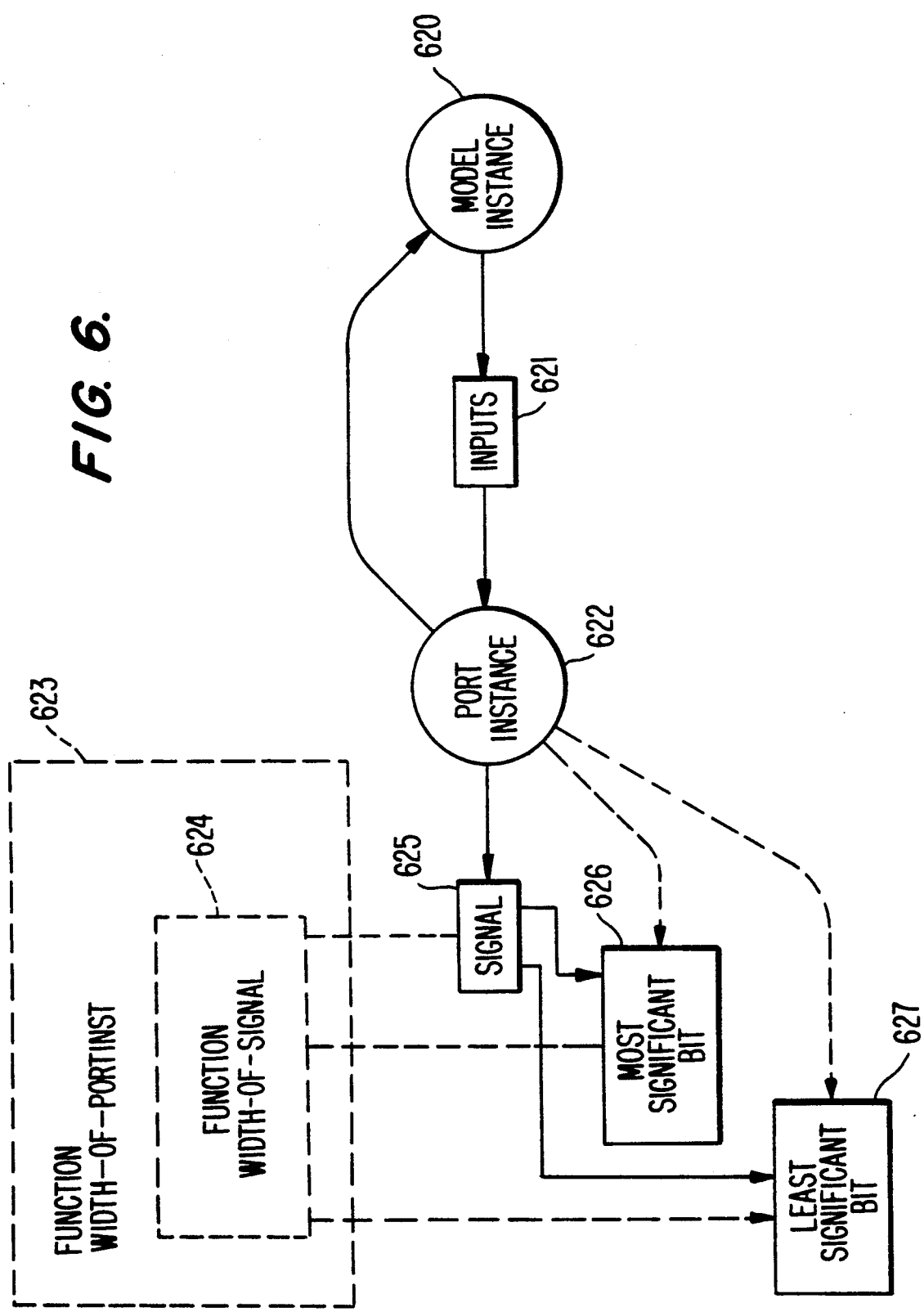
FIG. 6 is an example of the access of values which are calculated or derived, as opposed to stored database objects, according to the present invention.

Referring next to FIG. 6, the derived access of a signal's width is illustrated. The signal width, for the purpose of this illustration, is defined as the number of binary bits of a data path which the signal represents. The signal may have a least significant bit and a most significant bit, the convention of most binary digital computers. The width does not exist as a data base attribute, but is instead derived or calculated whenever asked for. By using the access name 'WIDTH OF SIGNAL OF-FIRST-INPUT', the recursion computation method follows backwards from model instance 620 to its inputs 621 to the first input 622 to signal 625. This function takes a signal as an argument, gets the most significant bit 626 and the least significant bit 627, calculates the width and returns it. The width is then passed back to the rule antecedent. An implied "equivalence" is built into the function 'WIDTH OF PORTINST' 623. Because of this implied equivalence, a simpler access name 'WIDTH OF 1ST INPUT' will return the same value as 'WIDTH OF SIGNAL OF 1ST INPUT'.

Figure 7:
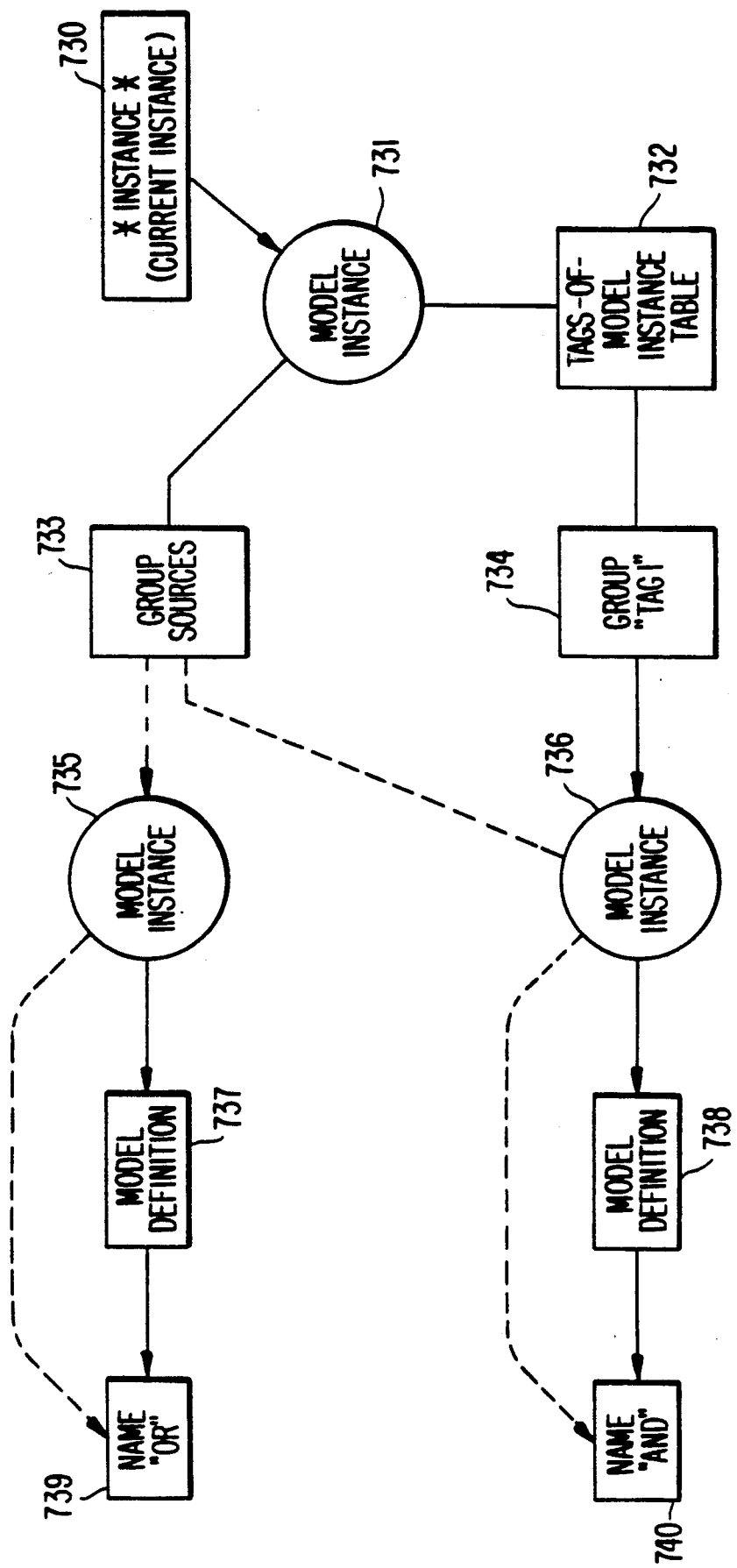
FIG. 7 is an example of the tagging of objects at the midpoint of a qualified object access, and the temporary tag pointers which are established for subsequent access by the rule according to the present invention.

Referring to FIG. 7, the operation of "tagging" a subset of data base objects at midpoints in a group of access paths is illustrated. A rule at the current model instance 730 and 731 may have an antecedent (ANY MODELS-TAG1 SOURCES ARE "AND"). The sources of model instance 731 are in group 733 of model instances 735 and 736. The collective search path continues backward for sources which are instances producing the input signals of the "current instance" through model definitions 737 and 738 to the names of model definitions 739 and 740. The terminal points of the search paths are the group of model names, ("OR" "AND"). The verb 'ARE' and the sentence primitive object "AND" are evaluated against each item in the group ("OR", "AND") returning a group of verdicts ('nil' 'true'). The 'ANY' function determines also the mid-paths group of potential taggable objects 735 and 736 because they follow the tag identifier 'TAG1'. The results of the evaluation of the end points ('nil', 'true') may now be used as a mask against the taggable objects to get that subset of the group 735 and 736 which is marked with 'true'. This operation produces the result group 734 of model instances 736 which is placed in a table of tags 732 of the current model instance 731 under the index 'TAG1'. For the remainder of the rule, the 'TAG1' may be accessed as a normal data base object pointed to by the current instance of this "skip" above access evaluation. It is possible to give an arbitrary name to the tagged object by using curly brackets. For example, the following antecedent may be used:

(ANY MODELS—TAG{AND_GATES}—SOURCES is "AND"). In this case, the tagged object 736 is put in a group 734 in the table of tags of the current model instances 732 under the index {AND_GATES}, and may be accessed by using the term {AND_GATES} for the remainder of the rule.

Figure 8:
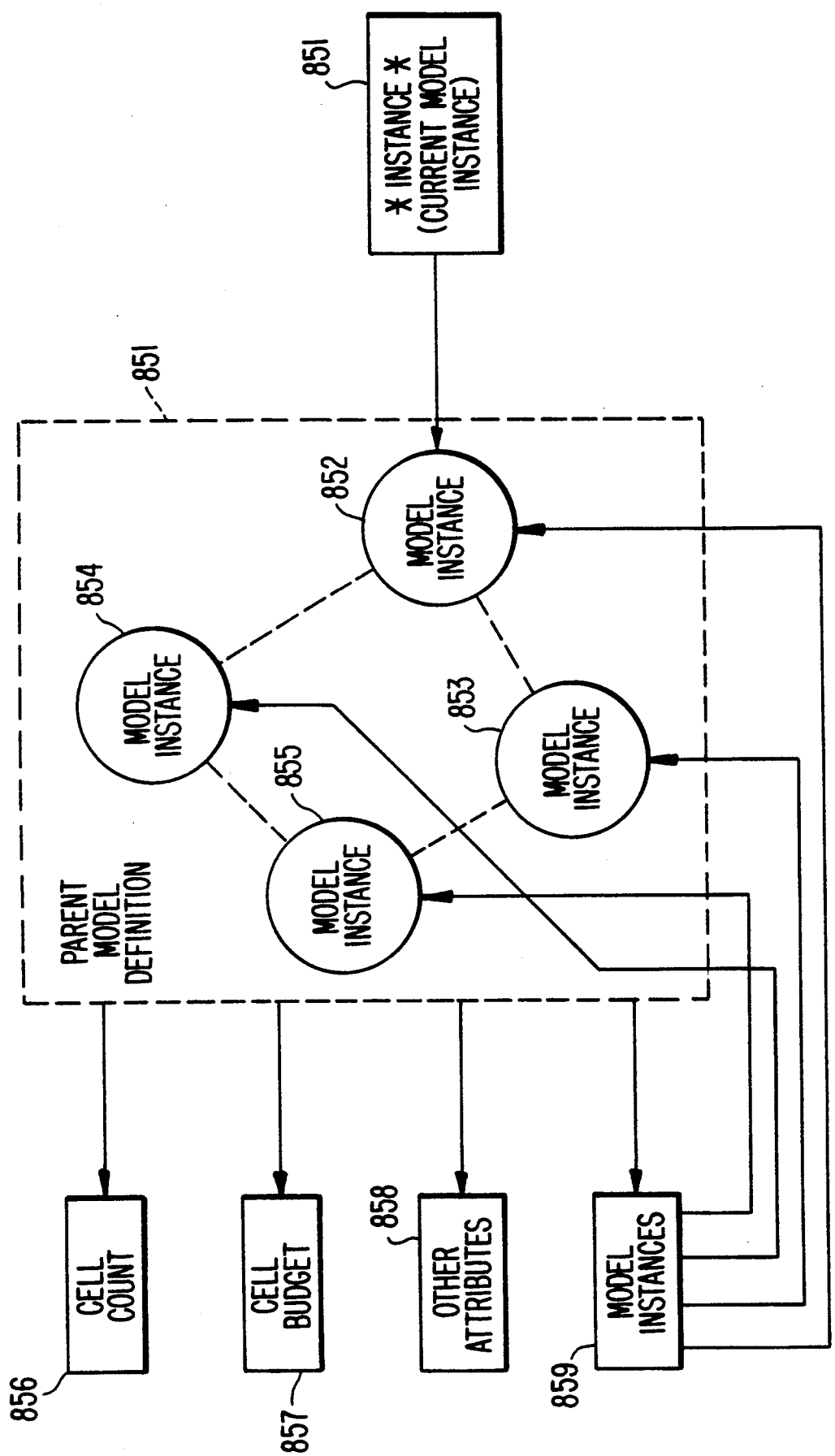
FIG. 8 illustrates the access from the current model instance to attributes of the parent model definition according to the present invention.

Referring next to FIG. 8, data base access of the parent model definition is illustrated. In the preferred embodiment, the keyword PARENT implies the parent of the current model instance, which is the current model definition. A rule could, therefore, follow current model instance 850 and 852 to parent 851 to any of the data base attributes of the parent 856, 857, 858 and 859. Among the attributes of the parent is a group 859 of model instances 855, 854, 853 and 852 of which the current model instance is one. In this manner, hierarchy may be followed upward to access more global data base parameters. It would be possible, following this convention, to access global technology parameters by going to the top level of the design data base, the current design.

Figure 9:
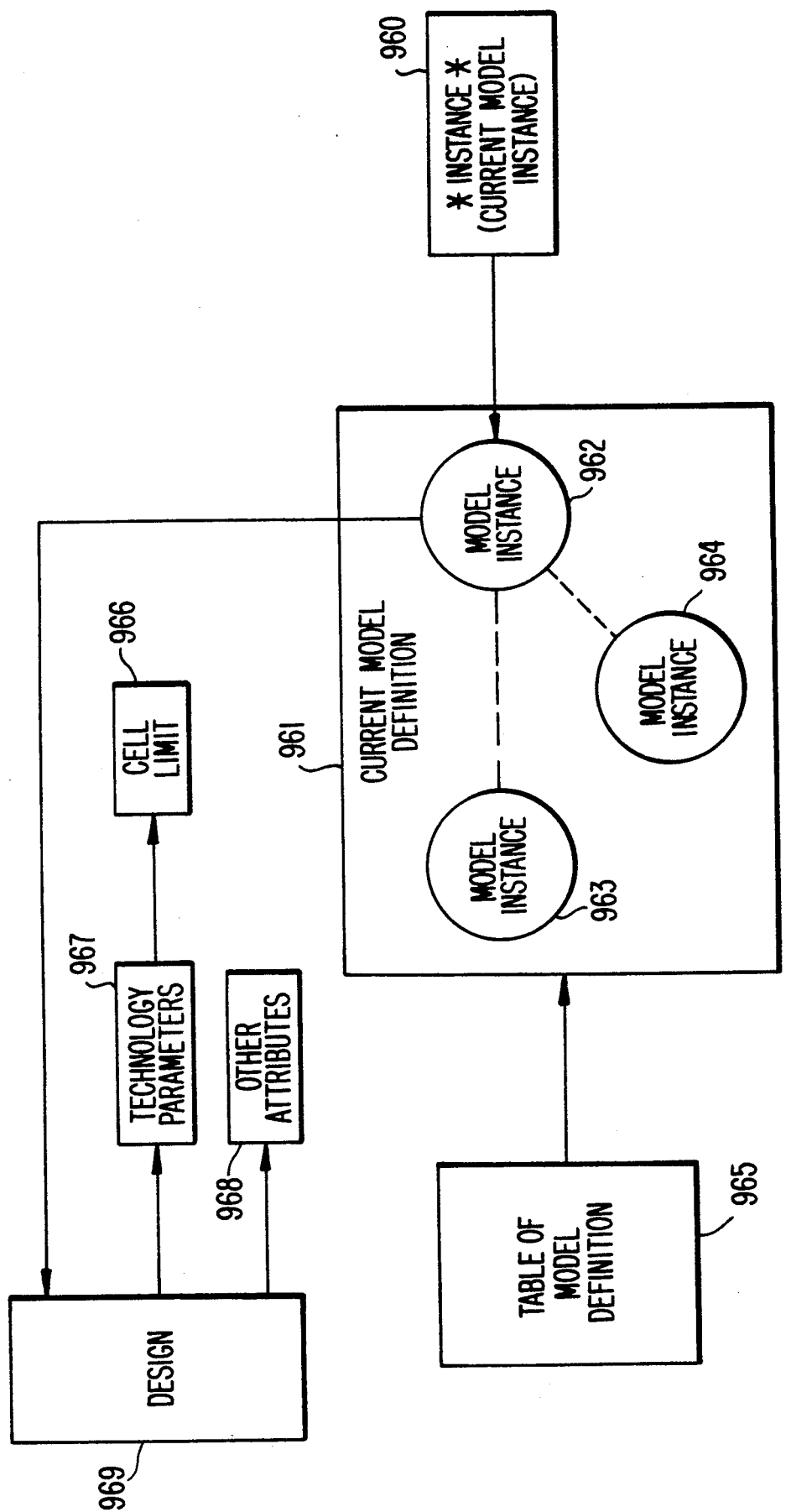
FIG. 9 illustrates the access from the current model instance to attributes of the current design according to the present invention.

Referring to FIG. 9, the access of the data base by more global parameters is illustrated. By going from the current model instance 960 and 962 to the current design 969, the technology parameters 967, such as cell count limit 966, may be accessed. Attributes at the design level typically are applicable to more than one model definition resident in the same design.

Operation of the Preferred Embodiment

Rules are used to encode that knowledge of a logic designer which causes a logic design in one form such as boolean to be changed into a functionally equivalent logic design in another form, i.e., technology components. The logic design data is kept in a data base hierarchy of design model definitions in a current design. Rules operate on the model instances of a current model definition. The model instances are structural operators or components interconnected by data base objects, port instances and signals. Collections of port instances also make up the path of pointers established by the data base.

The rule grammar has places in its sentence formats for qualified objects. The rule sentence, as entered in its textual entry format, needs to be concise, readable, and easily understandable. The assumption is made that the rule, at interpretation time, will perform tests and make changes to data relative to a current model instance, which is one of the model instances of the current model definition. The qualified objects in the rule being executed, therefore, need to provide complete access to the design data near or in some manner related to the current instance. The data base has pointers permitting the "walking" from the current instance (from object to object) until arrival at a desired end point. By stringing together the names of objects, separated by '—' or by '—of—', or some other character combination, a qualified noun can be created. If the walk is through many objects and is performed frequently, a name for "skip" across several objects may be defined, so that the syntax of the qualified noun is thereby shortened. If the data is desired that is not explicitly an object or attribute of the data base, a name for deriving the data may be defined, and tried in the qualified access string as if it were just another object in the data base.

When the rule for each qualified object is parsed and converted into executable form, the string of access forms becomes a nest of program functions with one argument, the current instance. During rule interpretation, the nest is (sometimes) recursively evaluated, causing the "walk" to the desired data base object (or group thereof) as the access evaluation phase is entered. The "walk" can also occur along sets of objects, returning a set or subset as the accessed item.

In the sentence format (ANY <qualified —object> <verb> <object>, when a TAGn or 'TAG{object}' is placed in the access string of the <qualified-object>, the end <qualified-object> must be a group or list. The evaluation of <qualified-object> causes several pointer paths to be followed in the logic design data base to arrive at the end point. Those end datum which, when applied with <verb> and <object> return a 'true' verdict, cause their individual access paths to be marked as 'true'. Those objects which followed the 'TAG' identifier and also which are on paths marked true are now grouped together and placed in a table of tagged items of the current instance. The tagged items may now be accessed by the remainder of the rule as normal data base objects. A tag item is valid within a rule where it was first evaluated and thus defined. The tagging of data base objects and attributes allows the rule to perform set manipulations easily by "skipping" evaluation of the same access function several times and by making decisions on relative data as opposed to absolute data. When the rule is exited, the table of tagged items is erased.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. In a data processing system, a method of synthesizing a circuit design by accessing data base objects in a data base organized as a data base structure and contained in a memory of said data processing system, said data base objects representing components of a circuit, the method comprising the steps, performed by the data processing system, of:
   creating, by the data processing system and in said memory, said data base structure by coupling said data base objects contained in said data base structure to allow said data base objects to be accessed in any order;
   parsing, by the data processing system, a noun which is contained in a rule stored in the memory, said noun including a sequence of connected key words that identify a traversal of the data base structure, the parsing step including the substep of
   interpreting said noun as a sequence of nested functions; and
   accessing, by the data processing system, the coupled data base objects contained in said data base structure in accordance with the traversal of said data base structure identified by the connected key words in said noun to perform a circuit design synthesis operation by modifying said data base structure.

2. The method of accessing a data base of claim 1 further including the step of including a name for one of said sequence of nested functions in said noun in said parsing step, said function name designating derived data as opposed to direct access data.

3. The method for accessing a data base of claim 1 wherein said noun identifies at least one of a plurality of said data base objects in said parsing step, said method further including the step of accessing said at least one data base object from said noun.

4. The method for accessing a data base of claim 3 wherein said noun identifies a plurality of sequential data base objects in said parsing step, said method further including the step of accessing said plurality of sequential data base objects identified by said noun.

5. The method of accessing a data base of claim 3 further including the step of executing a rule associated with a predetermined one of said plurality of data base objects, utilizing said predetermined data base object as an argument of said rule.

6. The method of accessing a data base of claim 5 further including the step of tagging intermediate objects of said plurality of sequential data base objects, said tagged objects capable of being accessed during said execution of said rule.

7. The method of accessing a data base of claim 4, wherein said plurality of sequential data base objects are a single path of a multi-branching circuit path and wherein other data base objects designate groups of data base objects by data base pointers, the method further including the step of branching from said single path to groups of paths by following said data base pointers to data base objects designated as said groups of data base objects.

8. The method of accessing a data base of claim 7 further including the step of selecting one path from said groups of paths by a positional indicator.

9. A data processing system, for synthesizing circuit designs, in which a data base contained in a memory of the data processing system at non-adjacent locations is accessed, the data processing system comprising:
   means for creating a data base structure in said memory in which coupled data base objects contained in said data base structure can be accessed in any order, said coupled data base objects representing circuit components;
   means for parsing a noun which is contained in a rule stored in the memory and which includes a sequence of connected key words that identify a traversal of the data base structure, by interpreting said noun as a sequence of nested functions; and
   means for accessing the coupled data base objects contained in said data base structure in accordance with the traversal of said data base structure identified by the connected key words in said noun to perform a circuit design synthesis operation by modifying said data base structure.

10. A circuit design synthesis process performed by a data processing system including a memory containing a plurality of rules having a consequence portion and an antecedent portion and a sequence of linked data base objects representing circuit components, the process being performed by the data processing system and comprising the steps, performed by the data processing system, of:
   determining, by the data processing system, whether the antecedent portion of a first one of the rules applied to a first one of the data base objects is true by performing a plurality of tests contained within the antecedent portion of the first rule, the antecedent portion of the first rule being true when each of the performed tests yields a result of true, and the performing of the plurality of tests including:
   performing, by the data processing system, a first one of the tests by evaluating an end point in the sequence of data base objects which was accessed from the first data base object and
   performing, by the data processing system, a second one of the tests by evaluating the end point in the sequence of data base objects which was accessed from an intermediate point in the sequence of data base objects, the intermediate point being determined based on a result of the first test and located between the first data base object and the end point; and when the antecedent portion of the first rule is true, thereafter performing, by the data processing system, the consequence portion of the first rule.

11. The process according to claim 10, wherein:

the performing of the first one of the tests includes stepping from object to object along at least one access path in the sequence of data base objects starting from the first data base object and progressing to the end point in the at least one access path, and evaluating the end point of the at least one access path to determine whether the first one of the tests is true for the end point; and the performing of the second one of the tests includes stepping from object to object along the at least one access path in the sequence of data base objects starting from the intermediate point in the at least one access path and progressing to the end point in the at least one access path, the intermediate point being determined based on a result of the first test and located between the first data base object and the end point, and evaluating the end point of the at least one access path to determine whether the second one of the tests is true for the end point.

12. The process according to claim 11, wherein the antecedent portion of the first rule includes a selected name for identifying the intermediate point in the at least one access path after the first test is performed.

13. The process according to claim 12, wherein the at least one access path includes a plurality of access paths and the selected name identifies a plurality of the intermediate points in the plurality of access paths.

14. A data processing system for performing a circuit design synthesis process, the data processing system having a memory in which a plurality of rules and a sequence of linked data base objects are stored and each of the rules having a consequence portion and an antecedent portion, the system comprising:

means for determining whether the antecedent portion of a first one of the rules applied to a first one of the data base objects is true by performing a plurality of tests contained within the antecedent portion of the first rule, the antecedent portion of the first rule being true when each of the performed tests yields a result of true, the determining means including:

means for performing a first one of the tests by evaluating an end portion in the sequence of data base objects which was accessed from the first data base object and means for performing a second one of the tests by evaluating the end point in the sequence of data base objects which was accessed from an intermediate point in the sequence of data base objects, the intermediate point being determined based on a result of the first test and located between the first data base object and the end point; and means for performing the consequence portion of the first rule when the antecedent portion of the first rule is true.

15. The system according to claim 14, wherein the determining means includes:

means for performing the first one of the tests by stepping from object to object along at least one access path in the sequence of data base objects starting from the first data base object and progressing to the end point in the at least one access path, and evaluating the end point of the at least one access path to determine whether the first one of the tests is true for the end point; and means for performing the second one of the tests by stepping from object to object along the at least one access path in the sequence of data base objects starting from the intermediate point in the at least one access path and progressing to the end point in the at least one access path, the intermediate point being determined based on a result of the first test and located between the first data base object and the end point, and evaluating the end point of the at least one access path to determine whether the second one of the tests is true for the end point.

16. The system according to claim 15, wherein the antecedent portion of the first rule includes a selected name for identifying the intermediate point in the at least one access path after the first test is performed.

17. The system according to claim 16, wherein the at least one access path includes a plurality of access paths and the selected name identifies a plurality of the intermediate points in the plurality of access paths.

* * * * *